United States Patent
Kawasaki et al.

(10) Patent No.: US 8,044,433 B2
(45) Date of Patent: Oct. 25, 2011

(54) GAN-BASED HIGH ELECTRON MOBILITY TRANSISTOR (HEMT) WITH AN EMBEDDED GATE ELECTRODE HAVING A FIRST RECESS PORTION AND A SECOND RECESS PORTION TO IMPROVE DRAIN BREAKDOWN VOLTAGE

(75) Inventors: Takeshi Kawasaki, Yamanashi (JP); Ken Nakata, Yamanashi (JP); Seiji Yaegashi, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 107 days.

(21) Appl. No.: 11/392,516

(22) Filed: Mar. 30, 2006

(65) Prior Publication Data

US 2006/0220065 A1 Oct. 5, 2006

(30) Foreign Application Priority Data

Mar. 31, 2005 (JP) .................................. 2005-101822

(51) Int. Cl.
*H01L 29/66* (2006.01)
*H01L 21/02* (2006.01)
(52) U.S. Cl. . 257/194; 257/282; 257/283; 257/E21.621; 257/E21.624; 257/E29.246

(58) Field of Classification Search .................. 257/192, 257/628, 283, 284, 330, E21.06, E21.621, 257/E21.624, E29.201, E21.403, 194, 201, 257/183, E29.246, E29.249
See application file for complete search history.

(56) References Cited

U.S. PATENT DOCUMENTS

| | | | | |
|---|---|---|---|---|
| 5,296,395 A | * | 3/1994 | Khan et al. ..................... | 438/149 |
| 5,925,903 A | * | 7/1999 | Iwanaga et al. ................ | 257/284 |
| 6,133,593 A | * | 10/2000 | Boos et al. ...................... | 257/194 |
| 6,278,144 B1 | * | 8/2001 | Kunihiro et al. ............... | 257/280 |
| 6,294,801 B1 | * | 9/2001 | Inokuchi et al. ............... | 257/192 |
| 6,492,669 B2 | * | 12/2002 | Nakayama et al. ............ | 257/282 |
| 6,639,255 B2 | * | 10/2003 | Inoue et al. .................... | 257/194 |
| 6,787,820 B2 | * | 9/2004 | Inoue et al. .................... | 257/192 |

FOREIGN PATENT DOCUMENTS

JP 2002-016245 A 1/2002

* cited by examiner

*Primary Examiner* — Lynne Gurley
*Assistant Examiner* — Jesse Y Miyoshi
(74) *Attorney, Agent, or Firm* — Westerman, Hattori, Daniels & Adrian, LLP

(57) ABSTRACT

A semiconductor device includes a substrate, a GaN-based semiconductor layer formed on the substrate, a gate electrode embedded in the GaN-based semiconductor layer, a source electrode and a drain electrode formed on both sides of the gate electrode, a first recess portion formed between the gate electrode and the source electrode, and a second recess portion formed between the gate electrode and the drain electrode. The first recess portion has a depth deeper than that of the second recess portion.

13 Claims, 6 Drawing Sheets

HORIZONTAL AXIS CORRESPONDS TO
LATERAL DIRECTION IN FIG. 1A

HORIZONTAL AXIS CORRESPONDS TO POSITIONAL RANGE FROM SECOND RECESS PORTION 38 TO DRAIN ELECTRODE 22

GAN-BASED HIGH ELECTRON MOBILITY TRANSISTOR (HEMT) WITH AN EMBEDDED GATE ELECTRODE HAVING A FIRST RECESS PORTION AND A SECOND RECESS PORTION TO IMPROVE DRAIN BREAKDOWN VOLTAGE

BACKGROUND OF THE INVENTION

1. Field of the Invention

This invention generally relates to semiconductor devices and fabrication methods therefor, and more particularly, to a GaN-based semiconductor device and a fabrication method therefor.

2. Description of the Related Art

The semiconductor device that employs a GaN-based semiconductor is utilized as a power device that operates at a high frequency and high power. For instance, an FET such as High Electron Mobility Transistor (HEMT) is known as a semiconductor device suitable for amplifying at high frequency bands, in particular, of microwave, sub-millimeter wave, and millimeter wave.

With respect to an FET that employs the GaN-based semiconductor such as HEMT, in other words, a GaN-based HEMT, the research and development is enhanced to realize the operation at a higher frequency and higher power. For this reason, there is a need for improving mutual inductance and drain breakdown voltage. Japanese Patent Application Publication No. 2002-16245 discloses the GaN-based semiconductor HEMT (hereinafter, referred to as conventional art) in FIG. 8. A recess portion is formed in an AlGaN electron supply layer and a gate electrode is connected to a source electrode in the recess portion.

According to the conventional art, however, the gate electrode is provided on a bottom surface of the recess portion. Therefore, if the drain breakdown voltage is increased, the mutual conductance (gm) will be decreased in the HEMT having a low threshold voltage. In this case, it is possible to operate at a high power, yet it is suitable for the operation at a high frequency.

SUMMARY OF THE INVENTION

The present invention has been made in view of the above circumstances and provides a semiconductor device that is capable of operating at a high power and high frequency and a fabrication method therefor.

According to one aspect of the present invention, preferably, there is provided a semiconductor device including: a substrate; a GaN-based semiconductor layer formed on the substrate; a gate electrode embedded in the GaN-based semiconductor layer; a source electrode and a drain electrode formed on both sides of the gate electrode; a first recess portion formed between the gate electrode and the source electrode; and a second recess portion formed between the gate electrode and the drain electrode. The first recess portion has a depth deeper than that of the second recess portion. In accordance with the present invention, the drain breakdown voltage can be enhanced by lowering the 2DEG density of the second recess portion. The source resistance can be reduced by increasing the 2DEG density of a portion below the first recess portion, thereby increasing the mutual conductance. In addition, the mutual conductance (gm) can be increased in the HEMT having a low threshold voltage, by embedding the gate electrode in a gate embedding portion. Thus, it is possible to provide a semiconductor device that is capable of operating at a high power and high frequency.

According to another aspect of the present invention, preferably, there is provided a fabrication method of a semiconductor device including: forming a GaN-based semiconductor layer on a substrate; etching the GaN-based semiconductor layer to form a first opening; etching the GaN-based semiconductor layer to form a second opening that partially overlaps the first opening; and forming a gate electrode in a portion where the first opening and the second opening overlap each other. In accordance with the present invention, a gate length is a size of a portion in which the first opening and the second opening overlap each other. Accordingly, it is possible to fabricate the semiconductor device having a short gate length, with an inexpensive apparatus. If the gate length can be made short, the mutual conductance can be enhanced and the gate capacitance can be reduced, thereby enabling the operation at a high frequency. It is thus possible to provide the fabrication method of the semiconductor device that is capable of operating at a high frequency with an inexpensive system.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

It is known that 2-Dimensional Electron Gas (2DEG) density is increased or decreased by a difference in polarization between an electron traveling layer and an electron supply layer. Polarization is classified into self-polarization and piezoelectric polarization. The self-polarization is caused by a difference in electronegativity between atoms that compose the GaN-based semiconductor. The piezoelectric polarization is caused by the stress in the semiconductor film due to the difference in the lattice constant.

Figure 1A:
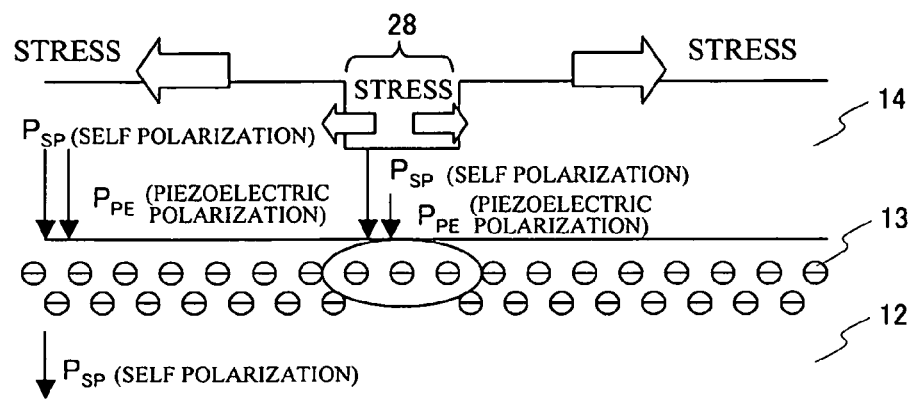
FIG. 1A and FIG. 1B illustrate increase and decrease of the 2DEG density caused by the polarization with an example of a GaN-based HEMT.
Figure 1B:
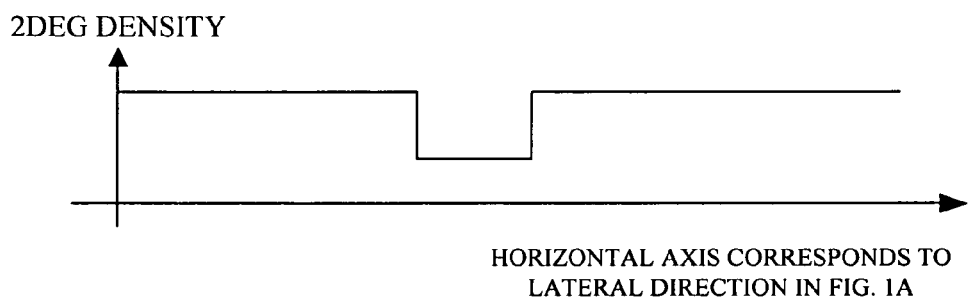

FIG. 1A and FIG. 1B illustrate increase and decrease of the 2DEG density caused by the polarization with an example of the GaN-based HEMT. In FIG. 1A, when a GaN electron traveling layer 12 and an AlGaN electron supply layer 14 are formed on a (0001) plane of a substrate, the self-polarization generated in the GaN electron traveling layer 12 is smaller than that generated in the AlGaN electron supply layer 14. In addition, the piezoelectric polarization is generated in a same direction as that of the self-polarization. Here, the piezoelectric polarization is caused by the stress due to the difference in the lattice constant in the AlGaN electron supply layer 14. Accordingly, in the interface of the GaN electron traveling layer 12 with the AlGaN electron supply layer 14, the 2DEG density that corresponds to the difference in polarization between the GaN electron traveling layer 12 and the AlGaN electron supply layer 14 is increased.

When a recess portion 28 is formed in the AlGaN electron supply layer 14, the self-polarization generated in the recess portion 28 of the AlGaN electron supply layer 14 is same as those of other portions in the AlGaN electron supply layer 14. On the other hand, the piezoelectric polarity generated in the recess portion 28 of the AlGaN electron supply layer 14 is smaller than those of other portions, since the stress due to the difference in the lattice constant is smaller in the recess portion 28. In FIG. 1B, the horizontal line represents a lateral direction in FIG. 1A, and the vertical line represents a 2DEG electron density. As shown in FIG. 1B, the 2DEG density of a portion below the recess portion 28 is smaller than other portions.

Hereinafter, a description will be given of embodiments of the GaN-based HEMT in which the above-described polarization is applied. The GaN-based HEMT has a higher mutual conductance and drain breakdown voltage, and is capable of operating at a high frequency and high power.

First Embodiment

Figure 2:
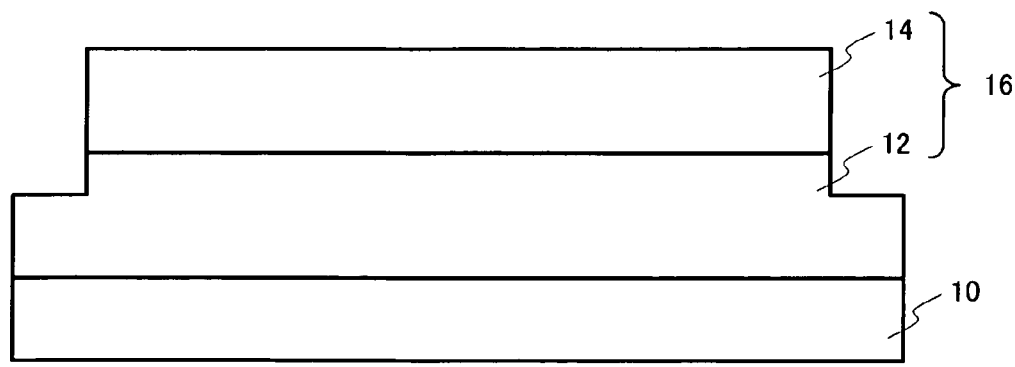
FIG. 2 through FIG. 5 are cross-sectional views illustrating a GaN-based semiconductor HEMT and a fabrication method therefor in accordance with a first embodiment of the present invention.

FIG. 2 through FIG. 5 are cross-sectional views illustrating a GaN-based HEMT and a fabrication method therefor in accordance with a first embodiment of the present invention. Referring now to FIG. 2, a GaN-based semiconductor layer 16 is epitaxially grown (formed) on a (0001) plane of a sapphire substrate, for example, by MOCDV. The GaN-based semiconductor layer 16 includes a GaN electron traveling layer 12 and an AlGaN electron supply layer 14. The GaN electron traveling layer 12 has a thickness of 2 μm, and the AlGaN electron supply layer 14 has a thickness of 25 nm. No impurities are added to the GaN electron traveling layer 12 or the AlGaN electron supply layer 14. A given region is removed by etching from the AlGaN electron supply layer 14 for element isolation.

Figure 3:
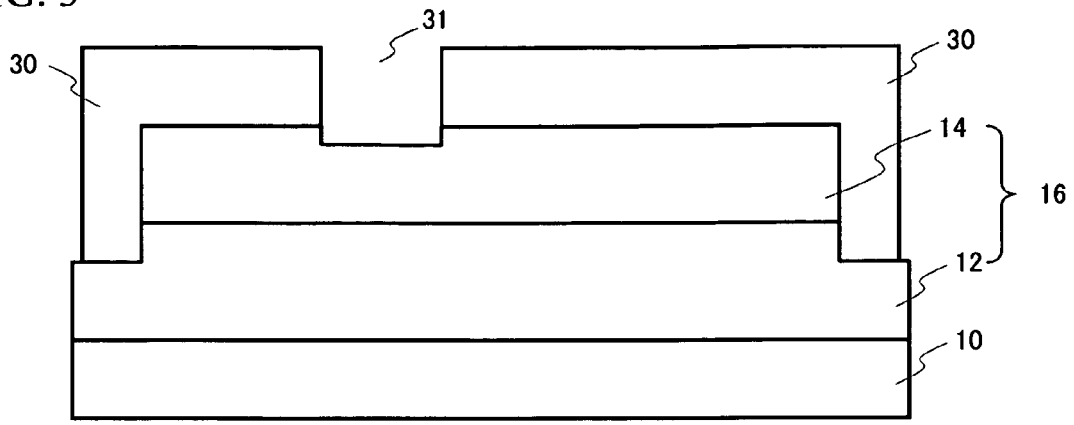

Referring now to FIG. 3, a photoresist 30 having an opening is formed by a normal exposure method. The AlGaN electron supply layer 14 is etched away by Reactive Ion Etching (RIE) by, for example, 5 nm to form a first opening 31.

Figure 4:
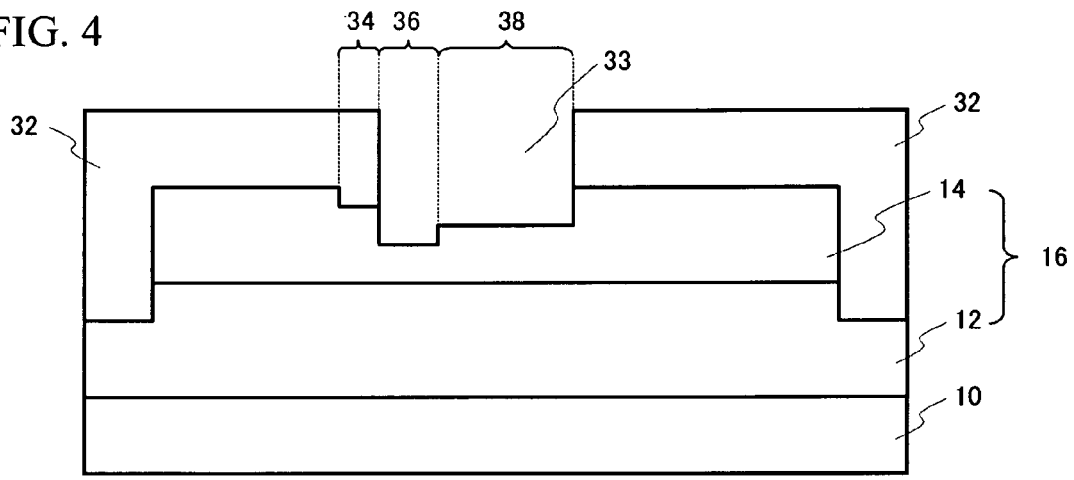

Referring now to FIG. 4, after the photoresist 30 is removed, a photoresist 32 is formed by the normal exposure method. The photoresist 32 has an opening that overlaps the first opening 31 by 0.3 μm. The AlGaN electron supply layer 14 is etched away by RIE by, for example, 10 nm, to form a second opening 33. At this time, etching is implemented to be deeper than that has been implemented to form the first opening 31. In this manner, a first recess portion 34 is formed when only the first opening 31 is etched, a gate embedding portion 36 is formed in a portion where the first opening 31 and the second opening 33 overlap each other, and a second recess portion 38 in formed when only the second opening 33 is etched.

Figure 5:
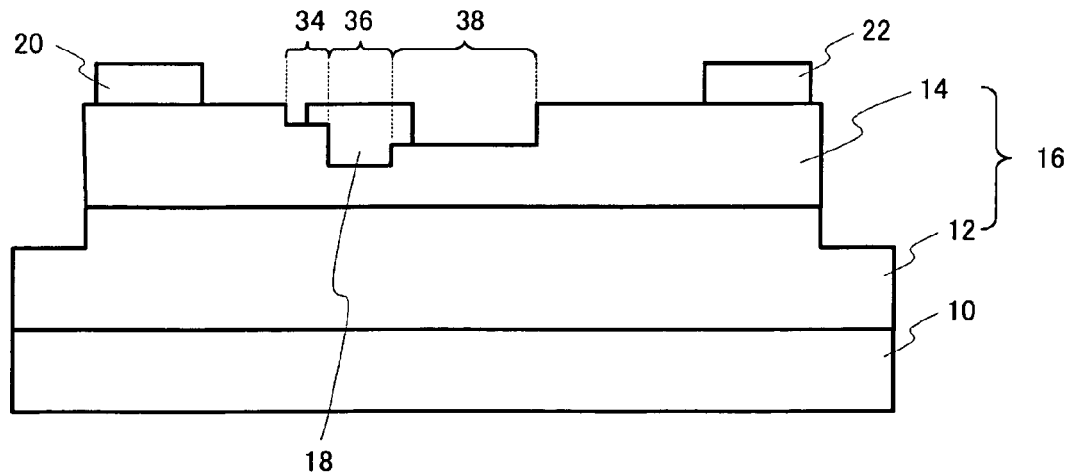

Referring now to FIG. 5, Ni/Au is formed as a gate electrode 18 in the gate embedding portion 36 where the first opening 31 and the second opening 33 overlap each other, by, for example, vapor deposition method and lift-off method. Also, Ti/Al is formed by the vapor deposition method and lift-off method, as an AlGaN source electrode 20 and a drain electrode 22.

The GaN-based HEMT produced as described heretofore includes a GaN-based semiconductor layer 16 formed on a substrate 10, a gate electrode 18 embedded in the GaN-based semiconductor layer 16, a source electrode 20 and a drain electrode 22 provided on both sides of the gate electrode 18, a first recess portion 34 formed between the gate electrode 18 and the source electrode 20, a second recess portion 38 formed between the gate electrode 18 and the drain electrode 22. The first recess portion 34 has a depth of approximately 5 nm, the second recess portion 38 has a depth of approximately 10 nm, and the gate embedding portion 36 has a depth of approximately 15 nm.

Figure 6:
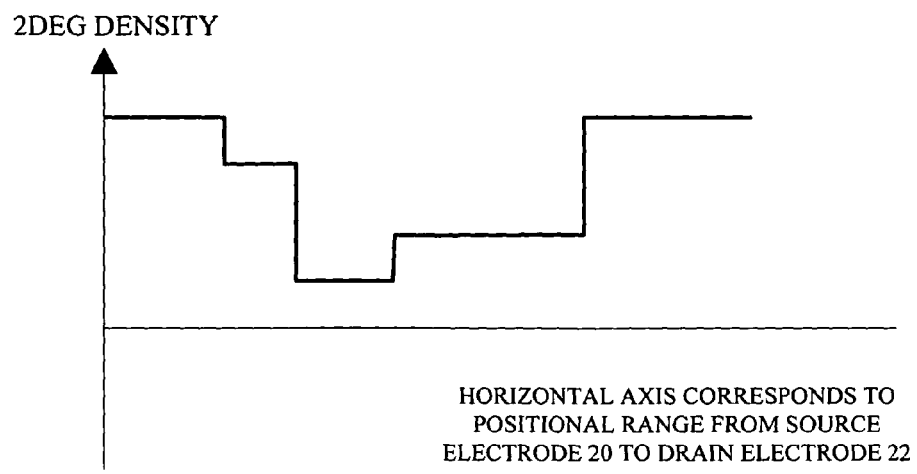
FIG. 6 shows the 2DEG density.

FIG. 6 shows the 2DEG density. The horizontal axis corresponds to a positional range from the source electrode 20 to the drain electrode 22. The vertical axis represents the 2DEG density. As described above, the 2DEG density varies depending on the thickness of the AlGaN electron supply layer 14. That is to say, the 2DEG density is the highest below the electron supply layer 14 where no recess portion is provided. The 2DEG density becomes lower in the order of a portion below the first recess portion 34, a portion below the second recess portion 38, and a portion below the gate embedding portion 36.

It is possible to improve the drain breakdown voltage by lowering the 2DEG density of a portion below the second recess portion 38. It is possible to decrease the source resistance by increasing the 2DEG density of a portion below the first recess portion 34. As a result, this can increase the mutual conductance. In addition, it is possible to improve the mutual conductance (gm) in the HEMT having a low threshold voltage, by embedding the gate electrode 18 in the gate embedding portion 36. The operation at a high breakdown voltage is enabled by improving the drain breakdown voltage, and the operation at a high frequency operation is enabled by increasing the mutual conductance.

In addition, the gate embedding portion 36 has a size of 0.3 μm, which corresponds to a size of a portion where the first opening 31 and the second opening 33 overlap each other, and this size corresponds to a gate length. For this reason, alignment accuracy of an exposure apparatus determines a minimum size of the gate length. In the first embodiment, even if an inexpensive exposure apparatus in which approximately 0.5 μm is a minimum size at exposure is used, the gate length of 0.3 μm is obtainable. Furthermore, it is possible to produce the HEMT having a minute gate length of, for example, approximately 0.1 μm, without using an expensive exposure apparatus such as an electron beam exposure apparatus. A shorter gate length is capable of improving the mutual conductance and reducing the gate capacitance, thereby enabling the operation at a high frequency. Therefore, the operation at a high frequency is available with an inexpensive system.

As described, in the first embodiment, the first recess portion 34 is made shallower than the second recess portion 38, making it possible to operate at a high breakdown voltage and high frequency. In addition, the gate embedding portion 36 is configured to correspond to the portion where the first opening 31 and the second opening 33 overlap each other, thereby making it possible to operate at a high frequency with an inexpensive system.

Second Embodiment

Figure 7:
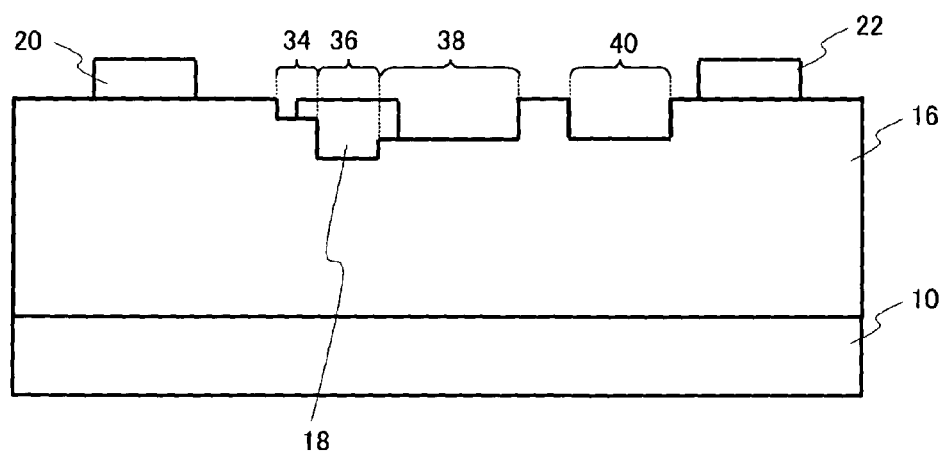
FIG. 7 is a cross-sectional view of a HEMT in accordance with a second embodiment of the present invention.

FIG. 7 is a cross-sectional view of a HEMT in accordance with a second embodiment of the present invention. The GaN electron traveling layer 12, not shown, and the electron supply layer 14, not shown, are formed on the substrate 10, as the GaN-based semiconductor layer 15. A first recess portion 34, a second recess portion 38, and a gate embedding portion 36 are formed on the GaN-based semiconductor layer 16. The source electrode 20 and the drain electrode 22 are provided on the GaN-based semiconductor layer 16. The fabrication method is same as described in the first embodiment. In addition, a recess portion 40 is formed between the second recess portion 28 and the drain electrode 22.

Figure 8:
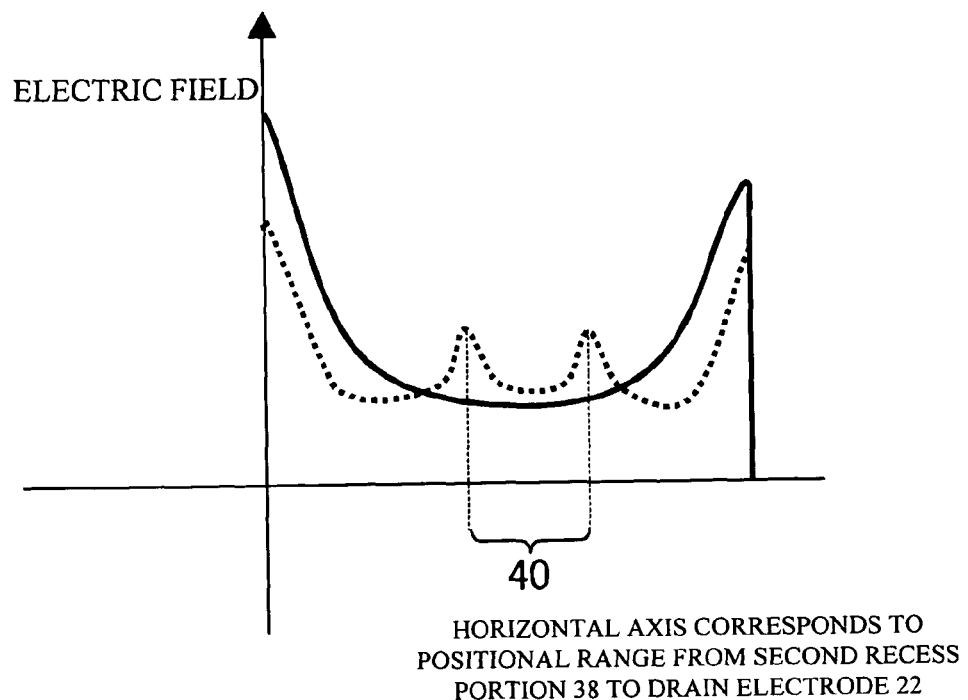
FIG. 8 is a graph showing an electric field between a second recess portion and a drain electrode.

FIG. 8 is a graph showing an electric field between the second recess portion 38 and the drain electrode 22, when the voltage is applied to the drain electrode 22. The horizontal axis corresponds a positional range from the second recess portion 38 to the drain electrode 22, and the vertical axis denotes an electric field E. The continuous line indicates an electric field of the GaN-based HEMT that does not include the recess portion 40 in accordance with the first embodiment, and the dashed line indicates the electric field of the HEMT that includes the recess portion 40 in accordance with the second embodiment. With the recess portion 40, peaks in the electric field are lowered. A voltage breakdown easily occurs at a high peak in the electric field. In the second embodiment, the peaks in the electric field are lower, making it possible to realize a higher drain breakdown voltage. This enables the operation at a higher power.

The recess portion 40 is formed simultaneously with at least one of the first opening 31 and the second opening 33, in the fabrication method in accordance with the first embodiment. This enables the HEMT in accordance with the second embodiment fabricated in a same fabrication method as that in accordance with the first embodiment, without adding additional process.

Figure 9:
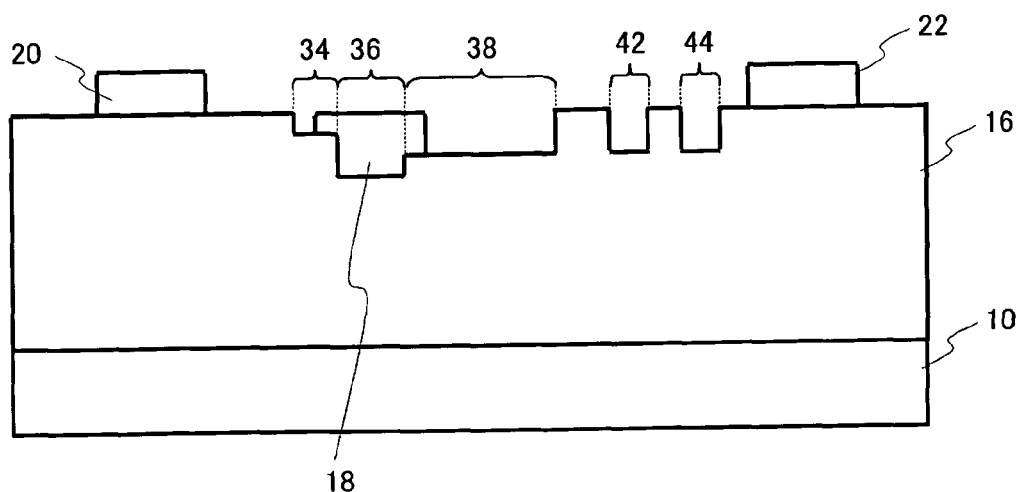
FIG. 9 is a cross-sectional view of the HEMT in accordance with a first variation example of the second embodiment of the present invention.

FIG. 9 is a cross-sectional view of the HEMT in accordance with a first variation example of the second embodiment of the present invention. Two recess portions 42 and 44 are provided between the second recess portion 38 and the drain electrode 22. The recess portions 42 and 44 are fabricated simultaneously with at least one of the first opening 31 and the second opening 33 in the fabrication method in accordance with the first embodiment. This eliminates the necessity of adding another fabrication process to the fabrication method in accordance with the first embodiment, so as to fabricate the HEMT in accordance with the variation example 1. With two recess portions, the peaks between the second recess portion 38 and the drain electrode 22 in the variation example 1 are lowered more than those in accordance with the second embodiment. This realizes a higher drain breakdown voltage, thereby enabling a higher power operation.

Figure 10:
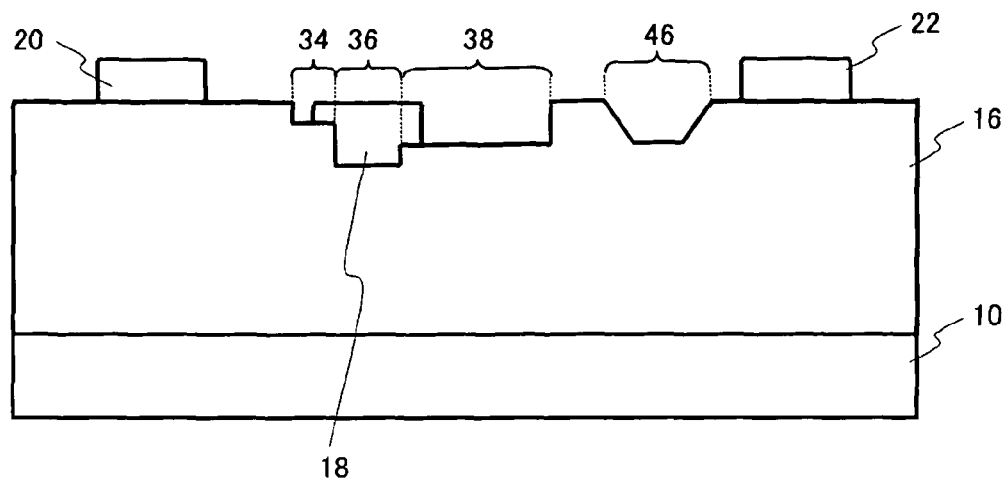
FIG. 10 is a cross-sectional view of the HEMT in accordance a second variation example of the second embodiment of the present invention.

FIG. 10 is a cross-sectional view of the HEMT in accordance a second variation example of the second embodiment of the present invention. A recess portion 46 having slanted side walls is provided between the second recess portion 38 and the drain electrode 22. The recess portion 46 is formed by, for example, wet etching a recess portion that is simultaneously formed with at least one of the first opening 31 and the second opening 33. The side walls of the recess portion 46 are slanted, thereby lowering the peaks in the electric field between the second recess portion 38 and the drain electrode 22 more than those of the HEMT in accordance with the second embodiment. This realizes the high drain breakdown voltage, thereby enabling a higher power operation. In addition, it is possible to reduce the distance between the recess portion 38 and the drain electrode 22, as compared to the first variation example.

Figure 11:
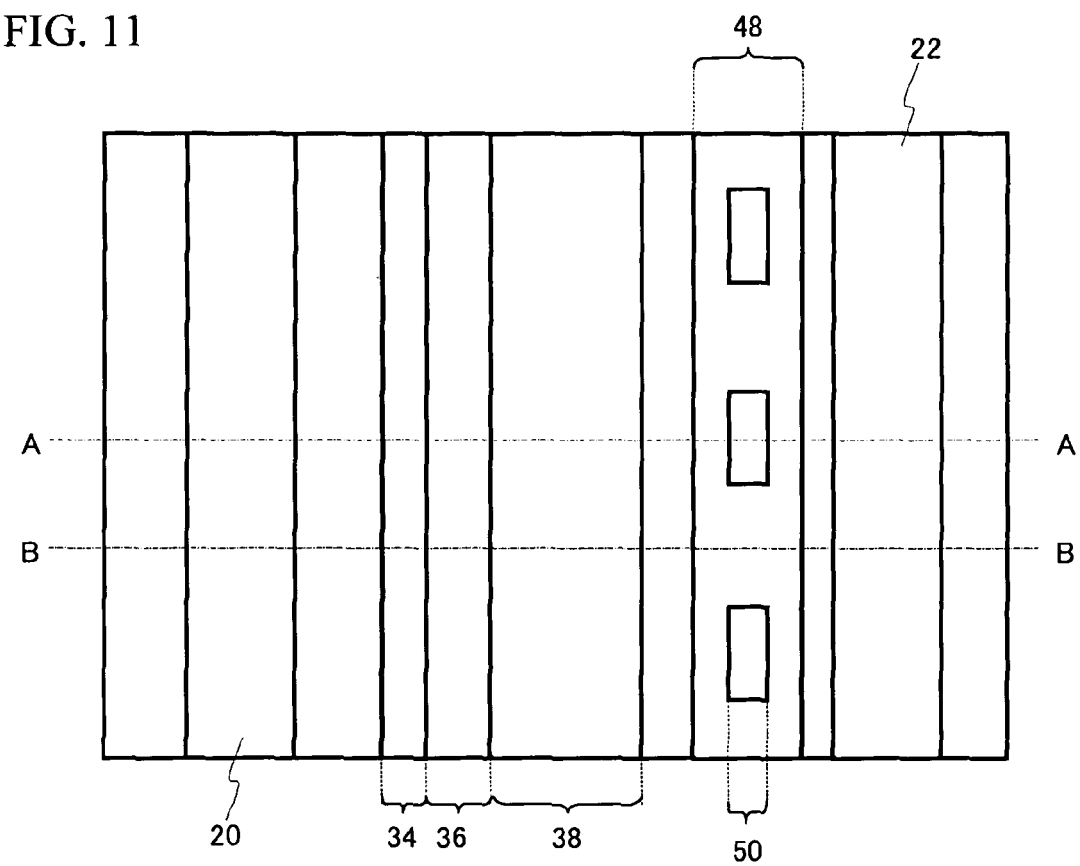
FIG. 11 is a top view of the HEMT in accordance with a third variation example of the second embodiment of the present invention.
Figure 12:
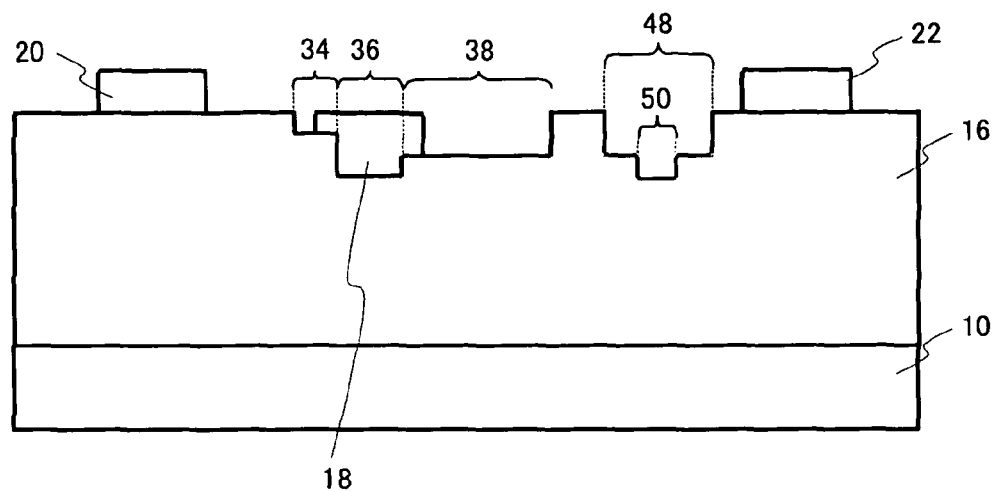
FIG. 12 is a cross-sectional view taken along a line A-A shown in FIG. 10.
Figure 13:
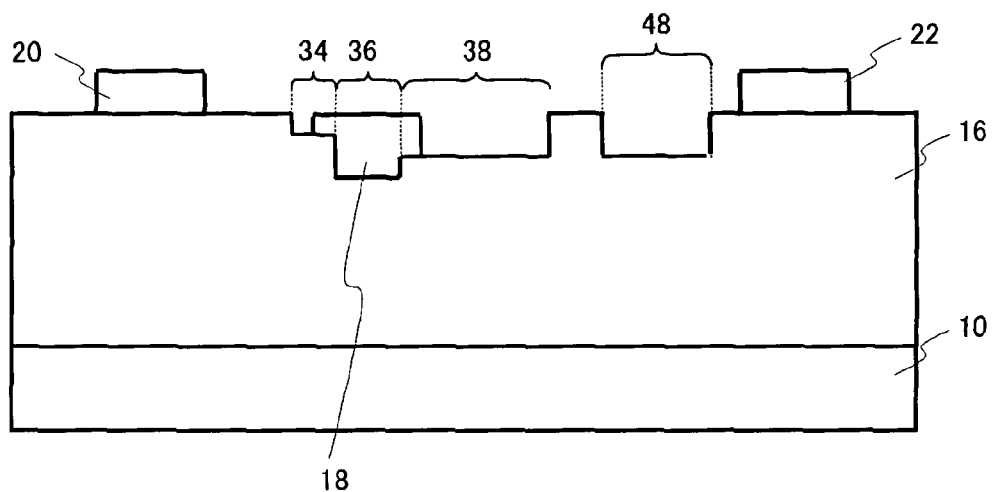
FIG. 13 is a cross-sectional view taken along a line B-B shown in FIG. 10.

FIG. 11 is a top view of the HEMT in accordance with a third variation example of the second embodiment of the present invention. FIG. 12 is a cross-sectional view taken along a line A-A shown in FIG. 11. FIG. 13 is a cross-sectional view taken along a line B-B shown in FIG. 11. A recess portion 48 is formed between the second recess portion 38 and the drain electrode 22, and a recess portion 50 is additionally formed in the recess portion 48. The recess portion 50 is shown in FIG. 12, yet is not shown in FIG. 13. The recess portion 50 is provided in a discontinuous manner. This is because the resistance between the second recess portion 38 and the drain electrode 22 will be increased and the mutual conductance will be decreased, if the recess portion 50 is provided in a continuous manner.

The recess portion 48 is formed simultaneously with either the first opening 31 or the second opening 33 in the fabrication method in accordance with the first embodiment. The recess portion 50 is formed simultaneously with the first opening 31 and the second opening 33 in the fabrication method in accordance with the first embodiment. This makes it possible to fabricate the HEMT in accordance with the third variation example in the same fabrication method as described in the first embodiment, without adding another fabrication process. The recess portion having two steps lowers the peaks in the electric field more than those between the second recess portion 38 and the drain electrode 22. This enables a higher drain breakdown voltage and a higher power operation.

In the first and second embodiments, the GaN electron traveling layer 12 and the AlGaN electron supply layer 14 are used as the GaN-based semiconductor layer 16. However, another GaN-based semiconductor may be applicable, if the 2DEG density can be varied by the depth of the recess portion. For example, the self-polarization and the piezoelectric polarization can be increased by employing a crystalline layer or a mixed crystal layer that includes at least one of GaN, AlN, and InN to form the GaN-based semiconductor layer 16. The depth of the recess portion can be reflected to the 2DEG density. In addition, the depth of the recess portion can be reflected to the 2DEG density more, by employing the GaN electron traveling layer 12 and the AlGaN electron supply layer 14. Furthermore, the self-polarization and the piezoelectric polarization can be increased by forming the GaN-based semiconductor layer 16 on a (0001) plane of the substrate. The depth of the recess portion can be reflected to the 2DEG density more.

A buffer layer may be formed between the GaN-based semiconductor layer 16 or the electron traveling layer 12 and the substrate 10. A protection layer may be formed on the electron supply layer 14. The sapphire substrate is employed for the substrate 10, yet another substrate such as a SiC substrate or GaN substrate may be employed. The description has been given of the GaN-based HEMT, yet is applicable to MESFET. In the afore-described cases, it is also possible to bring about the same effect as described in the first and second embodiments.

There is provided a semiconductor device including: a substrate; a GaN-based semiconductor layer formed on the substrate; a gate electrode embedded in the GaN-based semiconductor layer; a source electrode and a drain electrode formed on both sides of the gate electrode; a first recess portion formed between the gate electrode and the source electrode; and a second recess portion formed between the gate electrode and the drain electrode. The first recess portion has a depth deeper than that of the second recess portion.

In the afore-described semiconductor device, the GaN-based semiconductor layer may be formed on a (0001) plane of the substrate. In accordance with the present invention, it is possible to reflect the depth of the recess portion to 2DEG density, thereby making it possible to provide the semiconductor device that is capable of operating at a high power and high frequency.

In the afore-described semiconductor device, the GaN-based semiconductor layer may include either a crystalline layer or a mixed crystal layer composed of at least one of GaN, AlN, and InN. The GaN-based semiconductor layer may include a GaN electron traveling layer and an AlGaN electron supply layer.

The afore-described semiconductor device may further include a third recess portion formed in the GaN-based semiconductor layer provided between the second recess portion and the drain electrode. In accordance with the present invention, the peaks in the electric field between the second recess portion and the drain electrode are lowered, thereby increasing the drain breakdown voltage. This makes it possible to provide a semiconductor device that is capable of operating at a higher output.

There is provided a fabrication method of a semiconductor device including: forming a GaN-based semiconductor layer on a substrate; etching the GaN-based semiconductor layer to form a first opening; etching the GaN-based semiconductor layer to form a second opening that partially overlaps the first opening; and forming a gate electrode in a portion where the first opening and the second opening overlap each other.

In the afore-described fabrication method, the step of etching the GaN-based semiconductor layer to form the first opening may be performed with a smaller amount than the step of etching the GaN-based semiconductor layer to form the second opening that partially overlaps the first opening. In accordance with the present invention, the drain breakdown voltage can be enhanced by lowering the 2DEG density of the second recess portion. The source resistance can be reduced by increasing the 2DEG density of a portion below the first recess portion, thereby increasing the mutual conductance. In addition, the mutual conductance (gm) can be increased in the HEMT having a low threshold voltage, by embedding the gate electrode in a gate embedding portion. Thus, it is possible to provide a semiconductor device that is capable of operating at a high power and high frequency.

In the afore-described fabrication method, the step of forming the GaN-based semiconductor layer on the substrate may be a step of forming the GaN-based semiconductor layer on a (0001) plane of the substrate. In accordance with the present invention, it is possible to reflect the depth of the recess portion to 2DEG density, thereby making it possible to provide the semiconductor device that is capable of operating at a high power and high frequency.

In the afore-described fabrication method, the step of forming the GaN-based semiconductor layer on the substrate may be a step of forming a layer that includes either a crystalline layer or a mixed crystal layer composed of at least one of GaN, AlN, and InN. In the afore-described fabrication method, the step of forming the GaN-based semiconductor layer on the substrate is a step of forming a GaN electron traveling layer and an AlGaN electron supply layer.

In the afore-described fabrication method, a third recess portion may be formed in the GaN-based semiconductor layer provided between the second recess portion and the drain electrode at at least one of the step of forming the GaN-based semiconductor layer on the substrate and the step of etching the GaN-based semiconductor layer to form the first opening. In accordance with the present invention, the peaks in the electric field between the second recess portion and the drain electrode are lowered, thereby increasing the drain breakdown voltage. This makes it possible to provide a semiconductor device that is capable of operating at a higher output.

The present invention is not limited to the above-mentioned embodiments, and other embodiments, variations and modifications may be made without departing from the scope of the present invention.

The present invention is based on Japanese Patent Application No. 2005-101822 filed on Mar. 31, 2005, the entire disclosure of which is hereby incorporated by reference.

What is claimed is:

1. A semiconductor device comprising:
   a substrate;
   a GaN-based semiconductor layer formed on the substrate;
   a gate electrode embedded in the GaN-based semiconductor layer;
   a source electrode and a drain electrode formed on opposing sides of the gate electrode;
   a first recess portion formed between an embedded portion of the gate electrode and the source electrode; and
   a second recess portion formed between the embedded portion of the gate electrode and the drain electrode,
   wherein the GaN-based semiconductor layer in the first recess portion has a thickness larger than that of the GaN-based semiconductor layer in the second recess portion;
   wherein a first part of the gate electrode of the drain electrode side is formed directly on the second recess portion and is deeper than a second part of the gate electrode formed directly on the first recess portion; and
   wherein the first recess portion has a first bottom plane, the second recess portion has a second bottom plane and the first bottom plane is higher than all parts of the second bottom plane, and
   wherein the embedded portion of the gate electrode has a bottom plane which is lower than the first bottom plane of the first recess portion and the second bottom plane of the second recess portion.

2. The semiconductor device as claimed in claim 1, wherein the GaN-based semiconductor layer is formed on a (0001) plane of the substrate.

3. The semiconductor device as claimed in claim 1, wherein the GaN-based semiconductor layer includes either a crystalline layer or a mixed crystal layer composed of at least one of GaN, AlN, and InN.

4. The semiconductor device as claimed in claim 3, wherein the GaN-based semiconductor layer includes a GaN electron traveling layer and an AlGaN electron supply layer.

5. The semiconductor device as claimed in claim 1, further comprising a third recess portion formed in the GaN-based semiconductor layer provided between the second recess portion and the drain electrode.

6. The semiconductor device as claimed in claim 1, wherein a bottom surface of the embedded portion of the gate electrode is deeper than the first recess portion and the second recess portion.

7. The semiconductor device as claimed in claim 1,
   wherein the gate electrode is only embedded within the GaN-based semiconductor layer.

8. The semiconductor device as claimed in claim 1, further comprising:
a fourth recess portion formed between the first recess portion and the second recess portion,
wherein the GaN-based semiconductor layer in the fourth recess portion has a thickness smaller than that of the GaN-based semiconductor layer in the second recess portion,
and wherein a bottom surface of the embedded portion of the gate electrode is in contact with a bottom surface of the fourth recess portion.

9. The semiconductor device according to claim 1, wherein the entire bottom plane of the gate embedded portion is lower than the first bottom plane of the first recess portion and the second bottom plane of the second recess portion.

10. The semiconductor device according to claim 1, wherein the gate embedded portion extends between the first recess portion and the second recess portion.

11. The semiconductor device according to claim 1, wherein a width of the first recess portion is narrower than a width of the gate embedded portion.

12. The semiconductor device according to claim 11, wherein the width of the gate embedded portion is narrower than a width of the second recess portion.

13. The semiconductor device according to claim 1, wherein the gate embedded portion, the first recess portion and the second recess portion are all formed within the Ga—N based semiconductor layer.

* * * * *